(12) United States Patent
Watanabe et al.

(10) Patent No.: US 7,511,828 B2
(45) Date of Patent: Mar. 31, 2009

(54) THREE-DIMENSIONAL SHAPE MEASURING UNIT, PROCESSING UNIT, AND SEMICONDUCTOR DEVICE MANUFACTURING METHOD

(75) Inventors: Masahiro Watanabe, Yokohama (JP); Toshihiko Nakata, Hiratsuka (JP); Maki Tanaka, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 238 days.

(21) Appl. No.: 10/562,207

(22) PCT Filed: Jun. 24, 2004

(86) PCT No.: PCT/JP2004/009289

§ 371 (c)(1),
(2), (4) Date: Sep. 13, 2006

(87) PCT Pub. No.: WO2004/113833

PCT Pub. Date: Dec. 29, 2004

(65) Prior Publication Data

US 2007/0253001 A1    Nov. 1, 2007

(30) Foreign Application Priority Data

Jun. 25, 2003    (JP)    ............................. 2003-180753

(51) Int. Cl.
*G01B 11/24*    (2006.01)

(52) U.S. Cl. .................................................... 356/601

(58) Field of Classification Search ......... 356/601–623, 356/237.1–237.5
See application file for complete search history.

(56) References Cited

U.S. PATENT DOCUMENTS

| 4,982,438 | A | * | 1/1991 | Usami et al. ................. 382/154 |
| 5,548,405 | A | * | 8/1996 | Motosugi .................... 356/601 |
| 2003/0090651 | A1 | * | 5/2003 | Toyoshima et al. ........... 356/72 |
| 2003/0223087 | A1 | * | 12/2003 | Sasazawa et al. ........... 356/636 |

FOREIGN PATENT DOCUMENTS

| JP | 61-97504 | 5/1986 |
| JP | 7-243822 | 9/1995 |
| JP | 8-233547 | 9/1996 |
| JP | 08-247756 | 9/1996 |
| JP | 2000-173984 | 6/2000 |

* cited by examiner

*Primary Examiner*—Hoa Q Pham
(74) *Attorney, Agent, or Firm*—Antonelli, Terry, Stout & Kraus, LLP.

(57) ABSTRACT

A semiconductor device manufacturing technique measures simultaneously a plurality of points on a sample to realize a high-speed three-dimensional shape measurement and reflects it to setting of a processing condition in a semiconductor device process, thereby making it possible to realize stable device manufacture with high precision. A three-dimensional shape measuring apparatus loaded on a processing apparatus such as an etcher, a coater-developer, a baking machine, or a lithography machine measures a plurality of points (500) on a sample (300) at high speed by arranging a plurality of measurement heads (100) for measuring a three-dimensional shape of the sample and by combining it with movement of an loader/stage (200) loading the sample (300). By using this measurement result, feeding back for correcting a processing condition with respect to the subsequent sample (300) and feeding forward for correcting a processing condition in the next step are realized.

4 Claims, 9 Drawing Sheets

FIG. 1

101 : Head Interval Adjustment Mechanism
100 : Measurement Head
300 : Sample
500 : Points to be Measured
200 : Loader/Stage

CD Measurement Scan Mode

LER Measurement Scan Mode

FIG. 11A

Bottom LER

Mean Width = 52.8nm
Width Variation = 3.2nm
LER Period = 78nm

FIG. 11B

50% LER

Mean Width = 43.5nm
Width Variation = 2.9nm
LER Period = 72nm

THREE-DIMENSIONAL SHAPE MEASURING UNIT, PROCESSING UNIT, AND SEMICONDUCTOR DEVICE MANUFACTURING METHOD

TECHNICAL FIELD

The present invention relates to a technology for measuring three-dimensional shapes, and particularly to a technology effectively applied to a high-speed multipoint measuring apparatus for measuring three-dimensional shapes of samples such as semiconductors, a processing apparatus using the same, and the semiconductor device manufacturing method.

BACKGROUND ART

According to examination by the present inventors, in a recent semiconductor device manufacturing process, width of a pattern on a semiconductor is measured by a SEM (Scanning Electron Microscope) to control its process condition, and results of the measurement are fed back to process control parameters to control the process with high precision. This control is called APC (Advanced Process Control). As the pattern size of the semiconductor is reduced 100 nm order or less and a processing margin is smaller, not only a two-dimensional shape (shape viewed from right above) but also a three-dimensional shape of the pattern has to be measured and need to control the process with high precision is increased.

In contrast to this, Patent Document 1 (Japanese Patent Laid-Open Publication No. 2000-173984) discloses a technique of controlling an etching condition by combining an etching device and a sample surface evaluation system. Also, a device for measuring the three-dimensional shape of the sample include: a method called Scatterometry which measures an angle distribution or wavelength distribution of scattered lights to estimate the shape; a laser microscope which narrows a laser beam and do a scan to acquire height information from the brightness information of the detected beam; a confocal microscope which makes an illumination and detection through a pinhole to acquire height information from the brightness information of the detected light; and an interference microscope which detects a microscope image of an interference of a measurement beam and a reference beam to acquire height information from the brightness change information of the image.

There is also a method of an AFM (Atomic Force Microscope) which scans the surface by a minute probe with a very weak force. Or, there are methods of a stereo SEM which acquires depth information from a plurality of SEM images generated by varying the illumination direction of electron beams, a FIB-SEM which digs a cross-sectional surface by a FIB (Focused Ion Beam) to observe it from an oblique direction by a SEM, and an electron beam holography which re-construct a three-dimensional shape of a sample from a electron interference pattern.

DISCLOSURE OF THE INVENTION

However, even if any of the above methods is used, a need for measuring the multiple three-dimensional shapes in the wafer and clarifying the distribution in the wafer in order to control the process with high precision is increased. However, in order to meet the need, there is a problem such that measurement time is long and an increase in measurement frequency is impossible. Furthermore, a need for tightly incorporating the processing apparatus therein to make a measurement is also increased. In order to meet the need, compact integration of the processing apparatus and a three-dimensional shape measuring apparatus is required. Therefore, as described above, there is a problem of improving measurement throughput in the conventional technologies.

Accordingly, an object of the present invention is to solve the above problem, i.e., to provide a high-speed three-dimensional shape measuring apparatus by preparing a plurality of measurement heads. An object is to provide a device, which reduces an area necessary for installing the three-dimensional shape measuring apparatus and is capable of intimately incorporating a processing apparatus. Further, an object is to provide a function to detect and correct a relative position between a sample and a measurement head in order to avoid influences from vibration and deformation in the installation area.

Another object of the present invention is to provide a measurement function having a short time detection mode to measure a cross-sectional view of a pattern edge and meandering shape of the pattern edge about a pattern such as an edge of a wiring pattern.

Another object of the present invention is also to provide a function to display the measured three-dimensional shape in association with a wafer map to display comprehensibly the processing process condition.

Another object of the present invention is also to realize stable manufacture of devices with high precision by reflecting a shape parameter and an in-wafer distribution of the measured three-dimensional shape in setting the processing condition in a semiconductor manufacturing process.

To achieve the above objects, the present invention provides a plurality of measurement heads, thereby measuring a plurality of points on the sample simultaneously. Thus, the high-speed three-dimensional shape measurement can be realized. Furthermore, movement of the stage mounting the sample and that of the measurement heads are coordinated. Therefore, more points can be measured at higher speed. Also, since the movement of the stage mounting the sample and that of the measurement heads is coordinated, the device can be provided so as to reduce the necessary installation area and allow the processing apparatus to be incorporated tightly therein or attached directly thereto. Further, the device detects the relative position between the sample and the measurement heads and corrects the result of the three-dimensional shape measurement in order to avoid the influence from vibration or deformation in the installation area. Thereby, the three-dimensional shape measuring apparatus can be provided without depending on an environment of the installation site.

Also, the device measures, with respect to the pattern such as the edge of the wiring pattern, a three-dimensional profile along a small number of lines across the wiring pattern and the three-dimensional profile along a small number of lines extending along the wiring edge. Thereby, the short-time detection mode for measuring the cross-sectional view of the pattern edge and the meandering shape of the pattern edge can be realized.

Also, the device displays the measured three-dimensional shape in association with the wafer map or displays, on the wafer map, shape parameters extracted from the measured three-dimensional shape. Thus, by quantifying the results of the measurement, the processing condition can be displayed comprehensibly.

By facilitating visualization of the distribution of the measured three-dimensional shape on the sample, the shape parameter and the in-wafer distribution of the measured pattern of the semiconductor sample are fed back and/or fed forward, to the setting of the previous/subsequent process conditions. Thereby, the stable manufacture of devices with high precision can be realized.

As described above, according to the present invention, since the plurality of measurement heads for measuring the three-dimensional shape are provided and simultaneously the plurality of points on the sample are measured, the high-speed three-dimensional shapes measurement can be realized. Furthermore, since the movement of the stage mounting the sample thereon and that of the measurement heads can be coordinated, much more points can be measured at higher speed. And, by designing for such an operation as to cooperate with the movement of the stage mounting the sample and that of the measurement heads, the device can be provided so as to reduce the necessary installation area and allow the processing apparatus to be incorporated intimately therein or attached directly thereto. Furthermore, in order to avoid the influences vibration or deformation in the installation area, the device can detect the relative position between the sample and the measurement heads to correct the results of the three-dimensional shape measurement, so that the three-dimensional shape measuring apparatus can be provided without depending on the environment of the installation area.

According to the present invention, with respect to the pattern such as an edge of a wiring pattern, the three-dimensional profile along a small number of lines across the wiring pattern and the three-dimensional profile along a small number of lines extending along the wiring edge are measured, so that the short-time detection mode for measuring the cross-sectional view and the meander of the pattern edge can be realized.

Also, according to the present invention, the measured three-dimensional shape in association with the wafer map is displayed or the shape parameters extracted from the measured three-dimensional shape are displayed on the wafer map, so that by quantifying the results of the measurement, the processing condition can be displayed comprehensibly.

Further, according to the present invention, by offering comprehensibly the sample distribution of the measured three-dimensional shape with high throughput, the shape parameter and the in-wafer distribution of the measured three-dimensional shape of the pattern of the semiconductor sample can be fed back and/or fed forward to the setting of the previous/subsequent process condition. Therefore, the stable manufacturing of devices with high precision can be realized.

BRIEF DESCRIPTION OF THE DRAWINGS

FIG. 4 shows a principle of determining a three-dimensional shape based on a distribution of a scattered beam according to an embodiment of the invention, wherein

FIG. 5 shows an example for measuring and correcting a relative position between a sample and a measurement head according to an embodiment of the invention, wherein

FIG. 11 represents a screen display, in which the edge of the three-dimensional shape of the wiring portion is analyzed at any level, according to an embodiment of the invention, wherein

BEST MODE FOR CARRYING OUT THE INVENTION

Hereinafter, embodiments of the present invention will be described in detail with reference to the accompanying drawings. Note that, throughout all the drawings for explaining the embodiments, members having the same functions are denoted by the reference numerals and a repetitive description thereof will be omitted.

Figure 1:
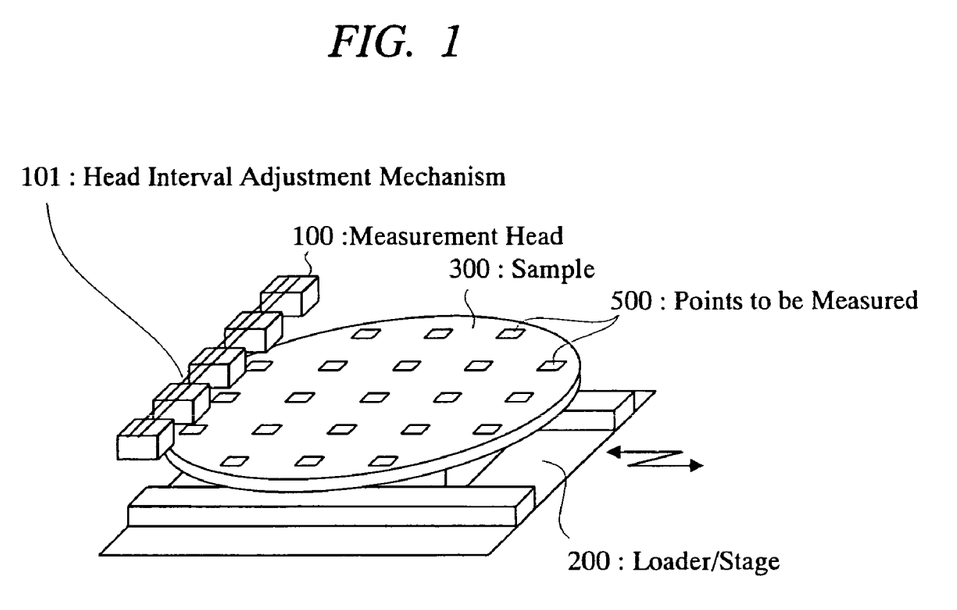
FIG. 1 is a view showing a construction of a principal portion of a three-dimensional shape measuring apparatus which measures a multipoint three-dimensional shape by a plurality of measurement heads according to an embodiment of the present invention.

First, with reference to FIG. 1, a construction of a principal portion of an example of a three-dimensional shape measuring apparatus according to an embodiment of the present invention will be described. FIG. 1 is a view showing a construction of the principal portion of the three-dimensional shape measuring apparatus which measures a multipoint three-dimensional shape by a plurality of measurement heads.

In the three-dimensional shape measuring apparatus according to this embodiment, the plurality of measurement heads 100 are arranged in a line and attached for measuring a three-dimensional shape of a sample. An interval between these measurement heads 100 can be adjusted depending on an interval between points to be measured 500 on a sample 300 by using a head interval adjustment mechanism 101. A sample 300 such as a semiconductor wafer is loaded on a loader/stage 200 and moved. When the sample 300 is moved while measured by the mechanism, a plurality of points on the sample 300 can be simultaneously measured.

In the example of the FIG. 1, by providing five three-dimensional shape measurement heads 100 and being measured at five points on the loader/stage 200, 5×5=25 points can be measured. However, in the example of the FIG. 1, since the points on four corners were out of the sample 300, actually measurable points are 21 points. Note that although the number of the measurement heads 100 and the number of measurements made by operating the loader/stage 200 are respectively five, these numbers freely selected are, needless to say, without departing from the scope of the present invention.

Alternatively, the measurement heads 100 can be moved in a horizontal direction of the FIG. 1 instead of moving the sample 300. That is, measurements may preferably be made by changing a relative position between the sample 300 and the measurement heads 100. Thereby, three-dimensional shape data on a plurality of points on the sample 300 can be obtained in a short time.

Also, by combining therewith other devices as described below, for example, in the case of being simultaneously installed and measured along with the processing apparatus, the loader/stage 200 may be omitted by disposing the measurement heads 100 on a path of the sample 300 to load/unload samples for the other devices and to measure them simultaneously at a time of loading/unloading. Thus, without providing a special area for installing the device for measuring the three-dimensional shape, the three-dimensional shape can be measured before, after, or before and after being processed and/or measured on the other devices.

Figure 2:
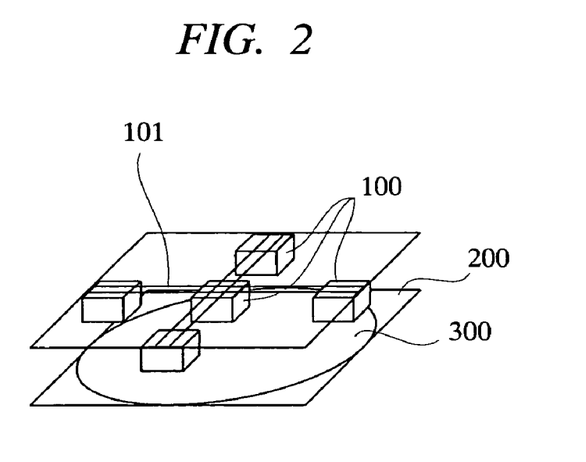
FIG. 2 is a view showing a construction of a principal portion of another three-dimensional shape measuring apparatus which measures the multipoint three-dimensional shape by the plurality of measurement heads according to the embodiment of the invention.

Next, with reference to FIG. 2, a construction of a principal portion of an example of another three-dimensional shape measuring apparatus according to an embodiment of the present invention will be described. FIG. 2 is a view showing a construction of a principal portion of another three-dimensional shape measuring apparatus which measures a multipoint three-dimensional shape by a plurality of measurement heads.

In the three-dimensional shape measuring apparatus shown in FIG. 2, five measurement heads 100 are arranged in a cross-shape. An interval between these and positions of these can be adjusted by using a head interval adjustment mechanism 101. The plurality of points to be measured on the sample 300 loaded on the loader/stage 200 by these measurement heads 100 can be measured simultaneously. By changing the relative position between a head group of the measurement heads 100 and the sample 300, the number of points to be measured can be further increased. Arbitrary selection of the number and arrangement of the measured heads 100 regardless of the construction of FIG. 2 has the same meaning as that of achieving an object of measuring simultaneously the plurality of points to be measured on the sample 300 and obtaining the distribution of the sample 300.

Figure 3:
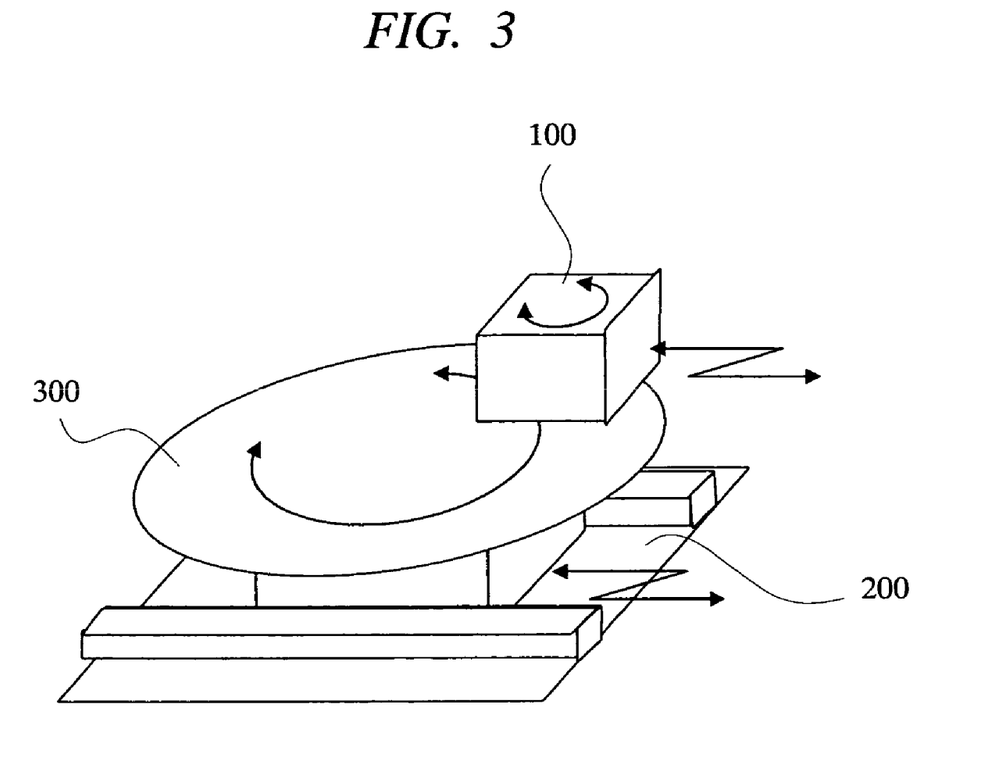
FIG. 3 is a view showing a construction of a principal portion of a compact, high-speed three-dimensional measurement shape device by an R-θ stage according to an embodiment of the invention.

Next, with reference to FIG. 3, a construction of a principal portion of an example of another three-dimensional shape measuring apparatus according to the embodiment of the present invention will be described. FIG. 3 is a view showing the construction of the principal portion of a compact, high-speed three-dimensional shape measuring apparatus by an R-θ stage.

The three-dimensional shape measuring apparatus shown in FIG. 3 shows an actual example of the compact, high-speed three-dimensional shape measuring apparatus by the R-θ stage. A rotation position of the sample 300 is controlled by the rotatable loader/stage 200. The loader/stage 200 also serves as a translation stage, which can move horizontally by a movement mechanism, that is, constitutes the so-called R-θ stage. Alternatively, the measurement head 100 may be translated instead of giving the loader/stage 200 a function of the translation stage. Alternatively, needless to say, both of the loader/stage 200 and the measurement head 100 may move to change the relative position between the sample 300 and the measurement head 100.

Based on this R-θ movement, any point on the sample 300 can be moved to a position measured by the measurement head 100. With this construction, a very compact multipoint three-dimensional shape measurement can be made. In some measurement methods, a direction of the measurement head 100 must be aligned to that of the pattern on the sample 300. Therefore, in this case, it is preferable that the measurement head 100 further has a rotation mechanism. In the case shown in the FIG. 3, although the number of the measurement head 100 is one, a plurality of measurement heads can be arranged as shown in the FIG. 1 or FIG. 2 to further improve measurement speed.

As described with reference to FIGS. 1 to 3, the three-dimensional shape measuring apparatus according to the present embodiment can be constructed by combining the plurality of measurement heads 100 or one measurement head 100 for measuring the three-dimensional shape of the sample 300 such as a semiconductor wafer with a mechanism such as the loader/stage 200 movably mounting the sample 300 thereon.

In the three-dimensional shape measuring apparatus according to the present embodiment, a variety of measuring methods can be employed for the measurement head 100. It includes: a method called Scatterometry which measures an angle distribution or wavelength distribution of scattered lights to estimate the shape; a laser microscope which narrows a laser beam and do a scan to acquire height information from the brightness information of the detected beam; a confocal microscope which makes an illumination and detection through a pinhole to acquire height information from the brightness information of the detected light; a method of varying a focus, performing an image processing of a plurality of images detected, computing a level of sharpness thereof, and acquiring height information from a position of the maximal level of sharpness; and an interference microscope which detects a microscope image of an interference of a measurement beam and a reference beam to acquire height information from the brightness change information of the image.

There is also a method of AFM, namely an Atomic Force Microscope which scans a surface by a minute probe with a very weak force. Or, there are methods of: a stereo SEM which acquires depth information from a plurality of SEM images generated by varying an illumination direction of charged particle beams such as electron beams or ion beams and by detecting secondary electron beams, reflected particle, or the like thereof; a FIB-SEM which digs a cross-sectional surface by a FIB to observe it from an oblique direction by a SEM; an electron beam holography which re-construct a three-dimensional shape of a sample from a electron interference pattern of a holography image detected; and the like.

Figure 4A:
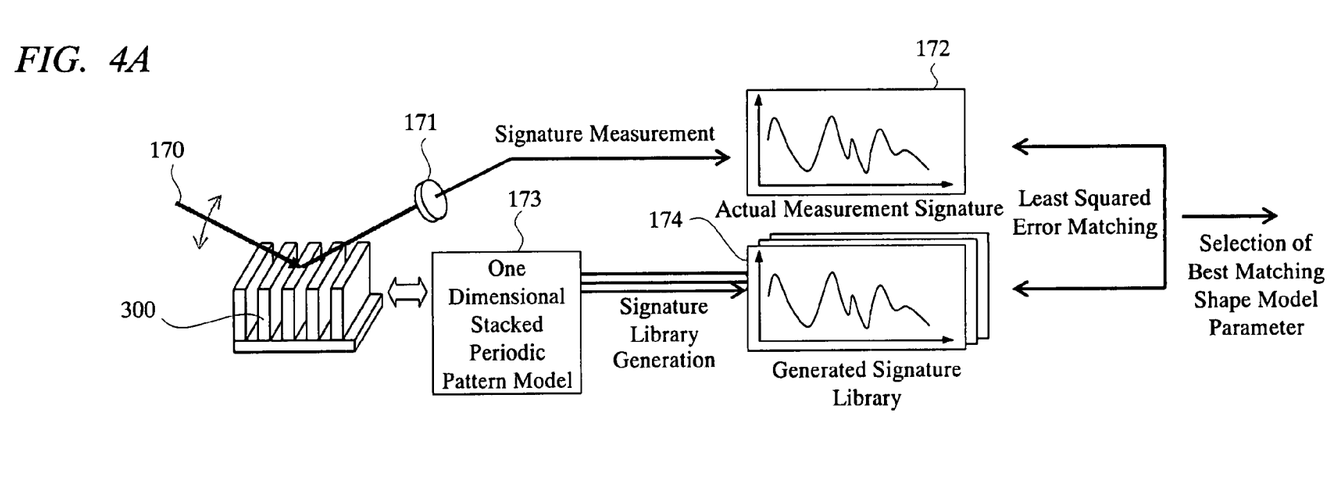
FIG. 4A is a view showing a library matching method and FIG. 4B is a view showing a regressive computation.
Figure 4B:
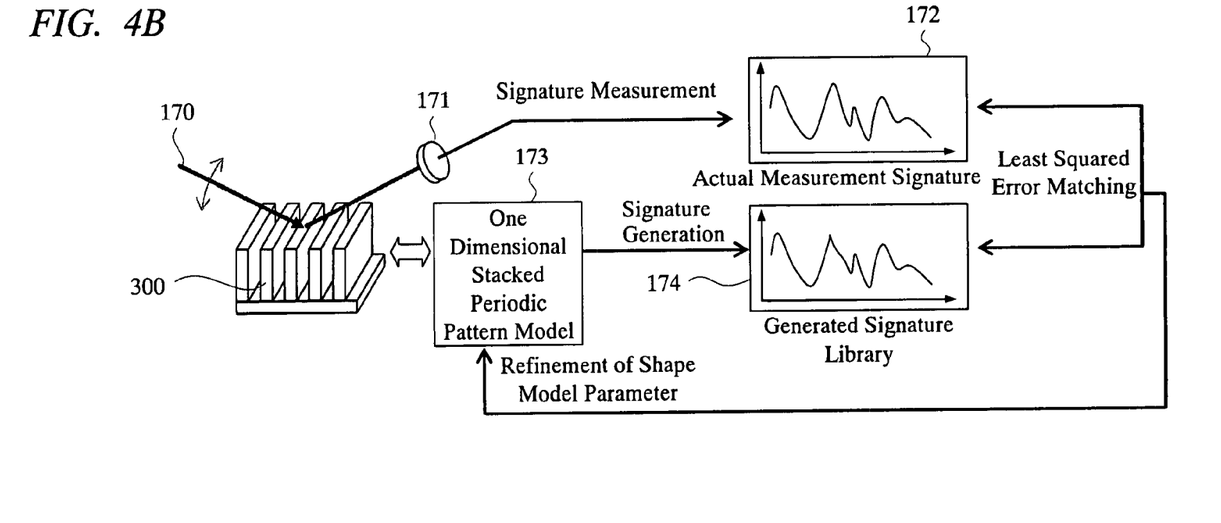

Next, with reference to FIG. 4, a principle of measuring a three-dimensional shape based on a scattered-light distribution will be described as an example of a measurement method by the measurement head. FIG. 4 represents a principle of measuring the three-dimensional shape based on the scattered-light distribution, wherein FIG. 4A is a view illustrating a library matching method and FIG. 4B is a view illustrating a regressive computation.

Light 170 is emitted to a pattern on the sample 300, and a scattered-light intensity is measured by a detector 171. At this time, an incident angle or detection wavelength of light is altered, and a change in the scattered-light intensity corresponding thereto is recorded as actual measurement signatures 172. The actual measurement signature 172 is compared with a theoretically generated signature 174 which is generated in a computer based on a periodical three-dimensional structure model 173 using the light scattering theory, and there is a method in which such a shape model parameter as to make both equal to each other are identified as a parameter that represents the shape of the sample 300.

At this time, there are: (a) the library matching method in which the generated signatures 174 are calculated in advance for a variety of shape model parameters to generate samples of the signatures (library) and a shape model which generates a signature most closely matching to the actual measurement signature 172 from the specimens is selected; and (b) the regressive computation in which the shape model parameters are adjusted so that the actual measurement signature 172 is most closely matching to the generation signature 174 by repetitive computations.

In the case of the system using Scatterometory, when there is used the construction in which the light is incident at a perpendicular angle to change its detection wavelength and obtain the actual measurement signature 172, detection characteristics do not change regardless of the rotation of the measurement head 100. However, when there is used the construction in which incident light is not perpendicular, the detection characteristics change according to the rotation of the measurement head 100. Thus, the measurement head 100 in an R-θ type construction as shown in FIG. 3 must be rotated according to a rotation of θ of the stage.

Next, an example of the case of measuring and correcting the relative position between the sample and the measurement head will be described with reference to FIG. 5. FIG. 5 represents examples of measuring and correcting the relative position between the sample and the measurement head, wherein FIG. 5A is a view illustrating the case of using a relative distance sensor and FIG. 5B is a view illustrating the case of being detected optically.

In almost all of the three-dimensional shape detection principle, a variation in the positions between the measurement head 100 and the sample 300 results in any shape measurement error, whereby there arises a problem. Unfortunately, the variation of the relative position between the measurement head 100 and the sample 300 may occur due to vibration or thermal deformation or the like. Thus, for correcting these, actual examples of measuring the relative position between the measurement head 100 and the sample 300 are considered.

Figure 5A:
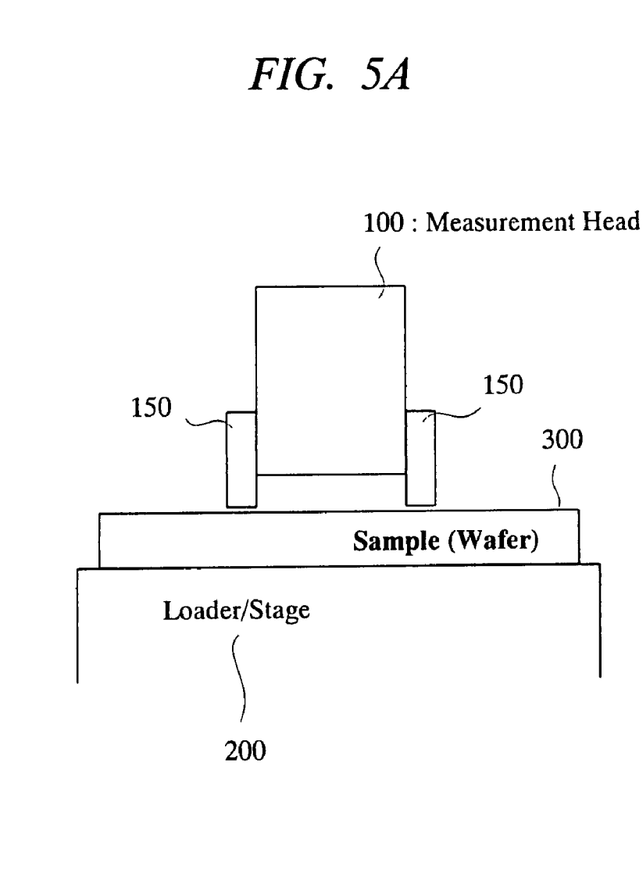
FIG. 5A is a view showing the case of using a relative distance sensor and FIG. 5B is a view showing the case of being optically detected.
Figure 5B:
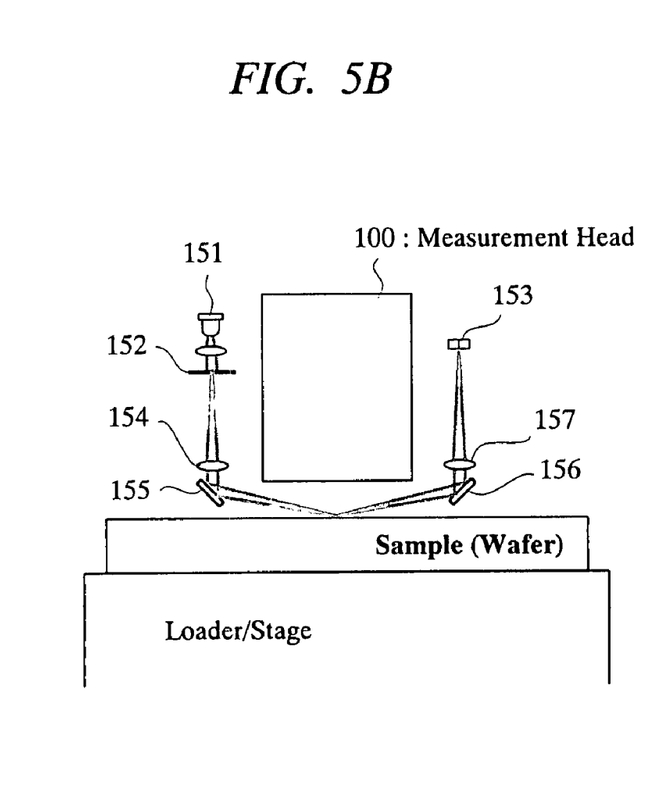

In FIG. 5A, the reference numeral "150" denotes a relative distance sensor 150 as a measurement means which measures a distance between the measurement head 100 and the sample 300. In FIG. 5A, two points on the sample 300 away from the position to be measured by the measurement head 100 are measured by the sensor 150. By providing two sensors 150 to measure two points which sandwich the position measured by the measurement head 100 and obtaining a weighted average of their result, the relative position between the measurement head 100 and the sample 300 at the position measured by the measurement head 100 can be obtained.

For example, when the sensors 150 are disposed at positions which are point-symmetric about the center of the measurement head 100, if an average of these measurement results with equal weights is calculated, the relative position between the measurement head 100 and the sample 300 at the position measured by the measurement head 100 can be obtained. For example, detection methods of the relative position include: a triangulation method in which a laser beam irradiates the sample to measure any change in the reflected position; a method to measure electrostatic capacity between the measurement head 100 and the sample 300; an eddy current method which uses an alternating magnetic field to create an eddy current in the sample 300 and measure the induced voltage; an air micrometer method which introduces air between the sample 300 and the sensor 150 to measure its air pressure; a method in which a laser beam is converged and irradiated on the sample 300; a method in which confocal detection is made and the distance of the sample 300 is measured from a point where the light intensity is to the maximum; and the like.

A method to measure a horizontal displacement as well as the height of the sample 300 includes: a method to use a laser speckle interference; a method to observe a pattern on the sample 300 by a microscope and obtain any shift of an image of this pattern by an image processing; a method similar to a linear scale in which a predetermined lattice pattern is formed on the sample 300 in advance and it is measured via the lattice pattern formed on the side of the sensor 150 to measure the horizontal position; and the like.

By using such means, the position of the measurement head 100, the stage of the sample 300, or both can be controlled by using the measured relative position between the measurement head 100 and the sample 300. Therefore, the measurement head 100 can always measure the three-dimensional shape at the same relative position. Alternatively, any change in the relative position between the sample 300 and the measurement head 100 during scanning by the measurement head 100 is recorded, and the change in the recorded relative position can be used to correct the shape data after the scanning. By doing so, the precise data on the three-dimensional shape can be obtained even when the relative position between the sample 300 and the measurement head 100 varies due to thermal deformation or vibration or the like.

In FIG. 5A, the two points on the sample 300 away from the position measured by the measurement head 100 on the sample 300 have been measured by the sensor 150. However, as another example, there will be described, by using FIG. 5B, an example for measuring a relative position located at the same place as that of the position measured on the sample 300 by the measurement head 100.

As shown in FIG. 5B, when an optical system is used as a measurement means, the light emitted from the light source 151 illuminates a slit 152 via a lens. An image of the slit 152 is formed on the sample 300 via a projection lens 154 and a reflective mirror 155. The light reflected on the sample 300 forms again an image on a detector 153 via a reflective mirror 156 and a detection lens 157. The detector 153 comprises a PSD (position sensitive device) which generates a voltage depending on a position of an image, a photodiode array, a linear image sensor, a two-dimensional image sensor, or the like, thereby detecting a change in the position of the slit image. By converting the change in the position of this slit image, the height of the sample 300 can be detected. Alternatively, there may be constituted so that the relative position between the measurement head 100 and the sample 300 can be measured coaxially with the measurement head 100 by using the above method.

Figure 6:
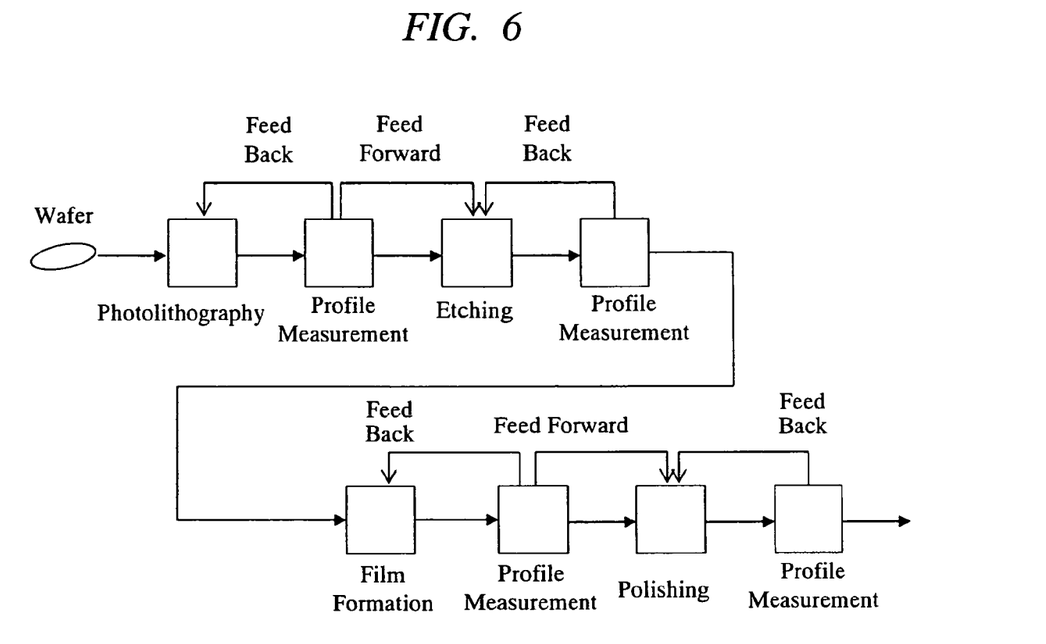
FIG. 6 is a view showing a concept of feeding back and feeding forward a profile measurement result to previous and/or subsequent processes according to an embodiment of the invention.

Next, an example a concept of feeding back or feeding forward the profile measurement result to a previous and/or subsequent process will be described. FIG. 6 is a view showing an example of a concept in which the profile measurement result is fed-back or fed-forward to the previous/subsequent process.

A semiconductor device manufacturing process includes: a photolithography step of applying resist to a wafer and forming a pattern of the resist through exposure and development; an etching step of forming a groove on a film material by using the resist as a mask; an film formation step of forming films of silicon oxide, polysilicon, metal such as aluminum, tungsten, and copper; and a polishing step of polishing the formed film to smooth its surface if necessary. These steps are repeated several times to form the device.

As the pattern size of the device is reduced to approximately 0.1 micrometers, it becomes difficult to form stably minute patterns due to the reduction of the process margin. In order to solve this problem, it is important to control the formation of the minute patterns by measuring the three-dimensional shape of the device pattern during the formation and by reflecting it to the condition of the previous/subsequent process. For this purpose, this embodiment provides a high-speed multipoint three-dimensional shape measurement means.

For example, since the profile of the resist pattern after the photolithography step is measured at high-speed, the measurement result can be fed-back to dose, focus, a development condition or the like in the photolithography step. Furthermore, the measurement result can be fed-forward to an etching condition in the subsequent step in order to cancel the deviation of width of the resist pattern from its designed width. For example, feed forward may be applied to conditions of: etching time; a concentration of etchant in the case of wet etching; plasma power and a gas concentration and the like in the case of plasma etching; and the like.

The profile measurement after the etching step can be fed-back to the etching time, the concentration of etchant, the plasma power and gas concentration, and the like. The profile measurement after the film formation step can be fed-back to a film formation condition in the previous process depending on flatness of the film, or be fed-forward to a polishing condition such as pressure and speed of polishing or slurry concentration in the subsequent process. The profile measurement result after the polishing can be also fed-back to a polishing condition of the polishing step.

Thus, the stable manufacture of minute devices can be carried out by measuring the three-dimensional shape of the wafer at high speed before/after each of steps such as the photolithography, etching, film formation, and polishing step and by feeding back and/or feeding forward the measurement result to its previous and/or subsequent process.

Figure 7:
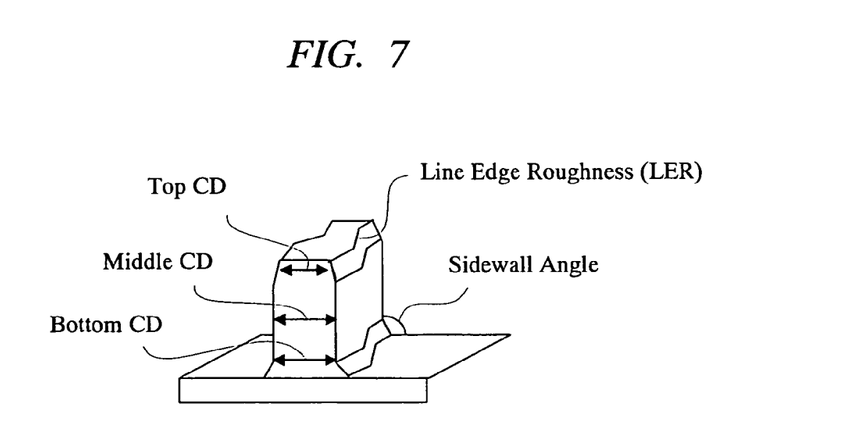
FIG. 7 is a view showing points to be measured on the three-dimensional shape of a wiring pattern according to an embodiment of the invention.

Next, an example of points to be measured for a three-dimensional shape of a wiring pattern will be described with reference to FIG. 7. The FIG. 7 is a view showing the measured points for the three-dimensional shape of the wiring pattern.

For the measured points of the three-dimensional shape of the wiring pattern, not line width (CD: critical dimension) but width of the top, the middle, and the bottom of the resist pattern (top CD, middle CD, and bottom CD, respectively), the angle of the sidewall, and meander of the line width (LER: line edge roughness) are measured. For example, since the width of the bottom is equivalent to a gate electrode in a gate wiring process, it significantly influences the operating characteristic (threshold voltage, switching speed, etc.) of the gate. The meander of the line width may also give the same influence. A sidewall angle influences a distribution of impurity concentration when impurity is doped into a semiconductor, thus influencing the operating characteristic of the gate. From the measured three-dimensional shape, dimension parameters as described above can be calculated and used for process control.

Figure 8:
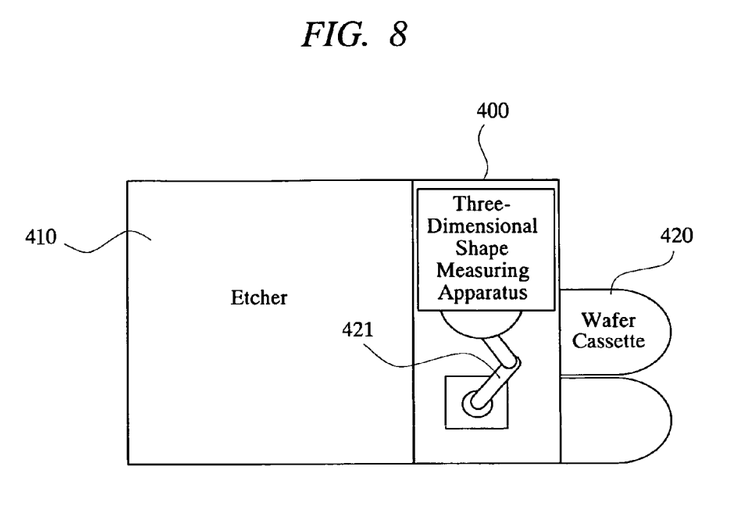
FIG. 8 is a view showing a processing apparatus, in which the three-dimensional shape measuring apparatus is mounted on an etcher, according to an embodiment of the invention.

Next, an example of a processing apparatus in which a three-dimensional shape measuring apparatus is mounted on an etcher will be described with reference to FIG. 8. FIG. 8 is a view showing the processing apparatus mounting the three-dimensional shape measuring apparatus on the etcher.

This processing apparatus installs a three-dimensional shape measuring apparatus 400, an etcher 410, and a wafer cassette 420 around a robot arm 421. A wafer is taken from the wafer cassette 420 by the robot arm 421, and loaded on the etcher 410 for an etching processing. Then, the three-dimensional shape measuring apparatus 400 measures its three-dimensional shape before the wafer is unloaded and returned to the wafer cassette 420.

The robot arm 421 is preferably provided with two arms so as to take the processed wafer from the etcher 410 and concurrently load the next wafer. Therefore, throughput of this processing can be further improved. In the above example, the case where the three-dimensional shape measurement by the three-dimensional shape measuring apparatus 400 is performed immediately after the etching processing and the result is fed-back to the condition of the etching step has been described. On the other hand, the measurement can be performed before the etching processing and the result can be fed-forward to the etching condition.

By using the example of the processing apparatus described with reference to FIG. 8, the three-dimensional shape of the pattern on the wafer can be measured by at least one of beforehand/afterwards with the etching, so that the etching condition can be controlled virtually with high precise without influencing the entire processing time. Furthermore, since the compact three-dimensional shape measuring apparatus 400 is loaded so as to share the etcher 410 and the robot arm 421, the measurement can be made without providing any installation area and before the processed device is subjected to a temporary change.

Figure 9:
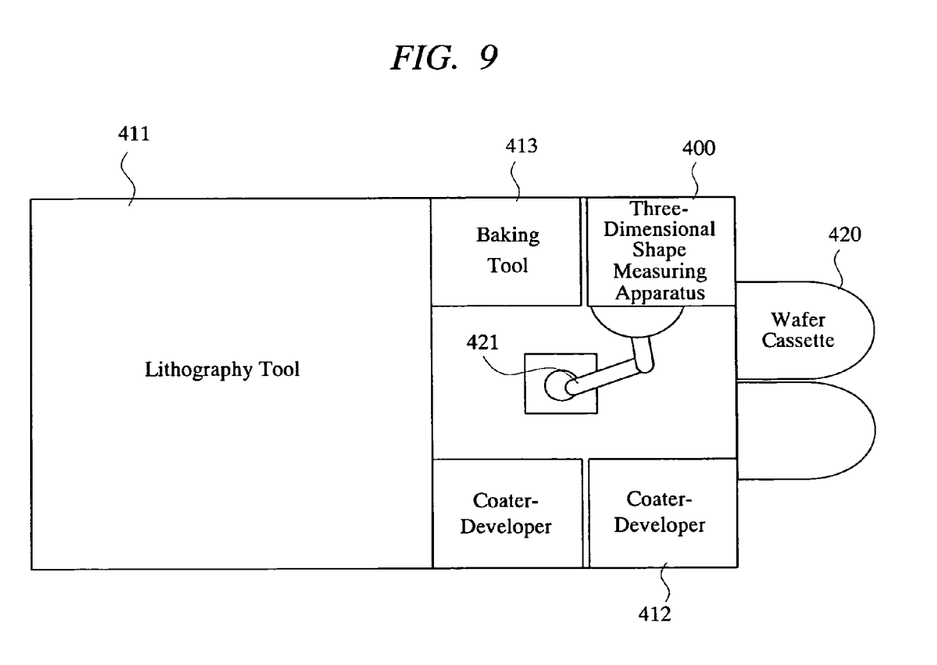
FIG. 9 is a view showing the processing apparatus, in which the three-dimensional shape measuring apparatus is combined with a coater-developer, a baking machine, and a lithography machine, according to an embodiment of the invention.

Next, an example of a processing apparatus incorporating a three-dimensional shape measuring apparatus in a coater-developer, a baking machine, a lithography machine will be described with reference to FIG. 9. FIG. 9 is a view showing the processing apparatus incorporating the three-dimensional shape measuring apparatus in the coater-developer, the baking machine, and the lithography machine.

This processing apparatus mounts a three-dimensional shape measuring apparatus 400, a coater-developer 412, a baking machine 413, a lithography machine 411, and a wafer cassette 420 around a robot arm 421. The robot arm 421 takes a wafer from the wafer cassette 420, the coater-developer 412 applies a resist to a wafer, the baking machine 413 pre-bakes the resist, and the lithography machine 411 exposes a minute pattern. The coater-developer 412 develops the resist pattern, the three-dimensional shape measuring apparatus (profile measurement tool) 400 measures the three-dimensional shape of the resist pattern and returns the wafer to the wafer cassette 420.

Therefore, since the profile of the resist pattern after the photolithography step is measured at high speed, the measurement result is fed-back to the dose, the focus, the development condition, and the like of the photolithography step. Therefore, the processing results of the photolithography step can be controlled with high precision virtually without influencing the entire processing time. Furthermore, since the compact three-dimensional shape measuring apparatus 400 is loaded so as to share the coater-developer 412, the baking machine 413, the lithography machine 411, and the robot arm 421, the measurement can be made without providing any installation area and before the processed resist is subjected to a temporal change.

Figure 10:
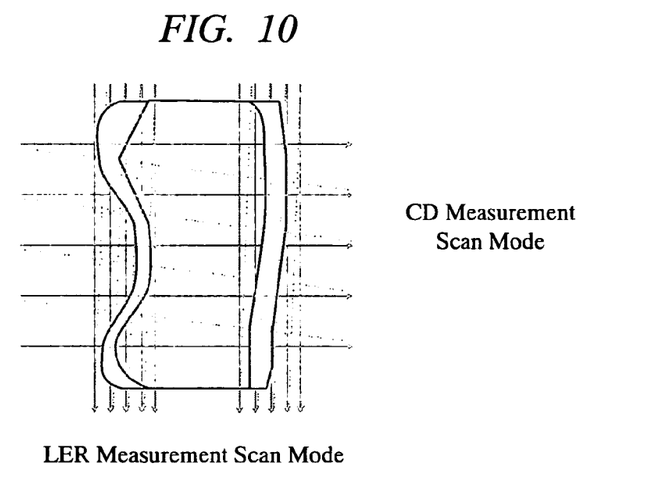
FIG. 10 is a view showing a scanning method for measuring in detail an edge of a three-dimensional shape of a wiring portion according to an embodiment of the invention.

Next, an example of a scanning method for measuring in detail a three-dimensional shape of an edge of a wiring portion will be described with reference to FIGS. 10 and 11. FIG. 10 is a view showing a scanning method for measuring in detail the three-dimensional shape of the edge of the wiring portion. FIG. 11 represents a screen display, wherein FIG. 11A is a view illustrating the slice at a height close to the underlayer and FIG. 11B is a view illustrating the slice at 50% height between the underlayer and the top of the pattern.

As described with reference to FIG. 7, points important in the three-dimensional shape of a wiring portion are the distance between a right edge and a left edge, i.e., width (CD) at the top, in the middle and at the bottom, sidewall angle of the edge, and meander of the edge (line edge roughness). In order to measure these points in detail in a short time, as shown in FIG. 10, there is performed two kinds of scanning as measurement modes, a CD measurement scan mode in which several lines (five lines in the case of FIG. 8) across a cross-section are scanned, and a LER (line edge roughness) scan mode wherein several lines along the edge are scanned.

Thereby, information on the three-dimensional shape of the necessary edge can be obtained in a shorter time than conventional methods in which the entire measurement area is scanned evenly by a dense (many lines) raster scanning. Scanning is carried out by electron beams, laser beams, AFM probes, or the like. As far as the scanning is capable of obtaining the shape information, any kind of scanning based measurement can be used. By finishing scanning in a short time, the information can be obtained immediately and, in addition thereto, damages to the sample can be kept to a minimum.

Figure 11A:
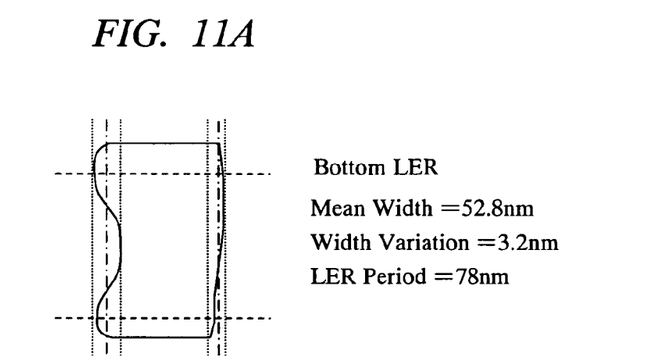
FIG. 11A is a view illustrating the case of height close to height of an underlayer and FIG. 11B is a view illustrating the case of 50% height at an intermediate between the underlayer and a top of the pattern.
Figure 11B:
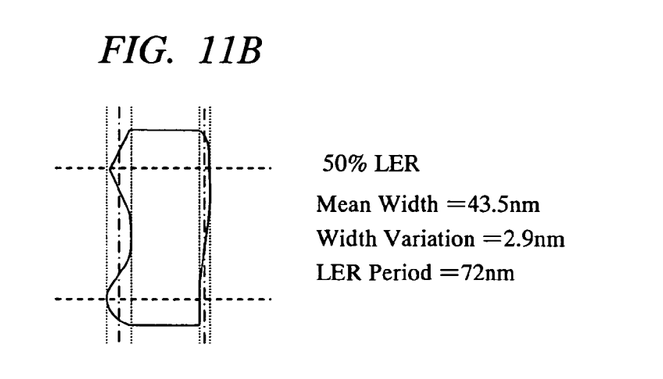

If the measurement result thus obtained is present, as shown in FIG. 11, the three-dimensional shape of the cross-sectional edge taken at any height can be displayed on a screen and its shape parameters such as mean width, width variation, and cycle length can be displayed. An example in FIG. 11A is shows a cross-sectional view taken at height close to the height of an underlayer and its shape parameters; and an example in FIG. 11B shows a cross-sectional view taken at 50% height at an intermediate between the underlayer and a top of the pattern and its shape parameters. Also, although not shown, the result of the three-dimensional shape measurement may be displayed in a manner of contour. By doing so, the result of the three-dimensional shape measurement obtained, especially, the shape of the edge is analyzed in detail, and the analysis can be reflected to the condition of the previous/subsequent processes.

Figure 12:
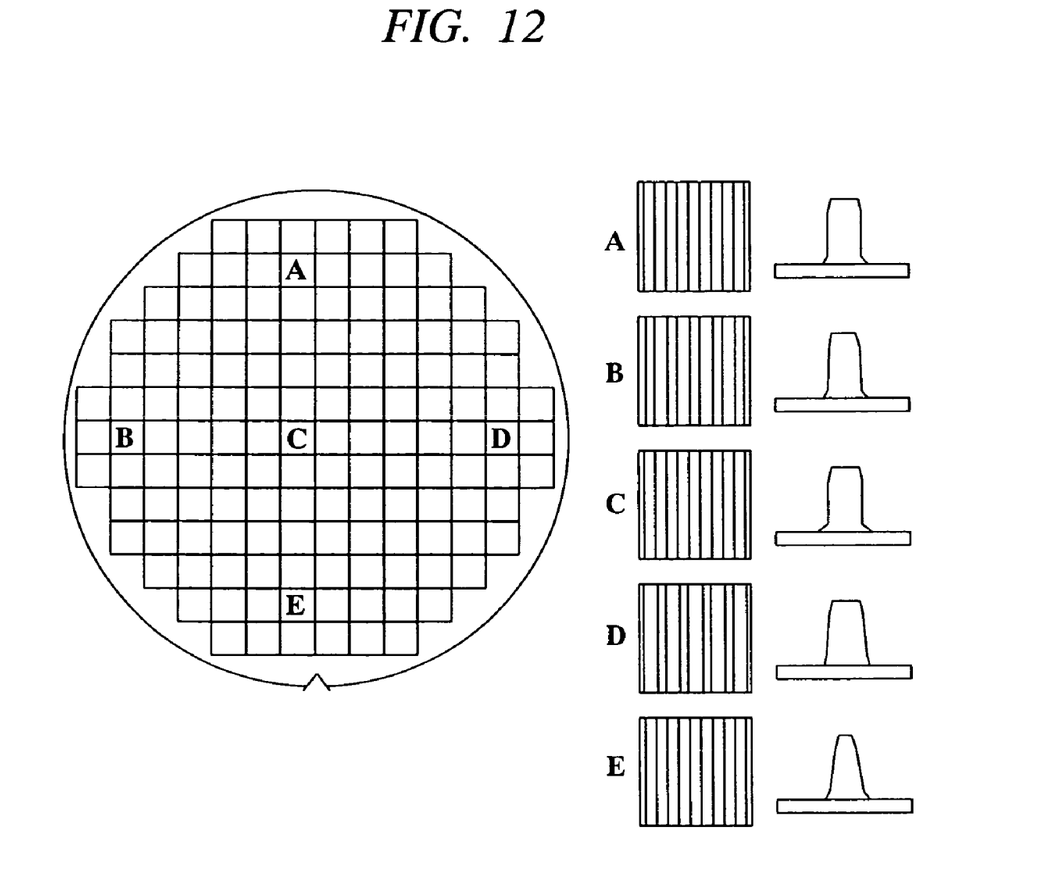
FIG. 12 is a view showing a screen display of the in-wafer distribution of the three-dimensional shape according to an embodiment of the invention.
Figure 13:
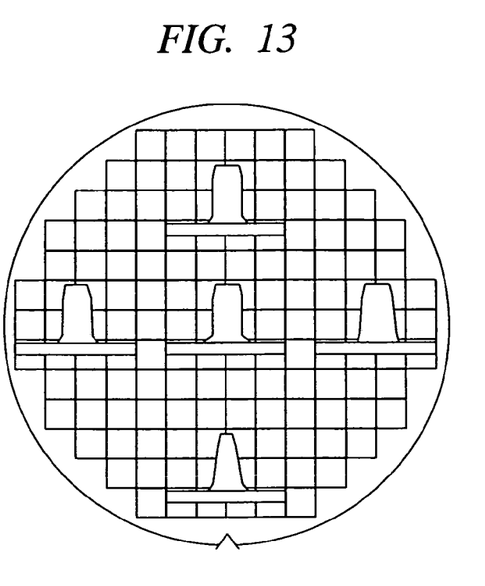
FIG. 13 is a view showing another screen display of the in-wafer distribution of the three-dimensional shape according to an embodiment of the invention.

Next, an example of a screen display of an in-wafer distribution of the three-dimensional shape will be described with reference to FIGS. 12 to 14. FIG. 12 is a view showing a screen display of an in-wafer distribution of the three-dimensional shape; FIG. 13 is a view showing another screen display; and FIG. 14 is a view showing a screen display of an on-wafer distribution of a plurality of dimension parameters.

By using the three-dimensional shape measuring apparatus 400, the three-dimensional shape at a plurality of points on a wafer can be measured at high speed, and the result thereof can be displayed on a display means as shown in, for example, FIG. 12. The left side illustrates a view showing points of measurement dies, while the right side displays three-dimensional shape data obtained by measuring measurement dies (A, B, C, D and E, in the example of FIG. 12) corresponding thereto. What is displayed on the right side is a view, in which height is converted to a gray scale value and is displayed on a two-dimensional screen, and a view showing a cross-section shape of the pattern. Thus, by comparing and illustrating the points on the wafer and the corresponding three-dimensional shapes of the pattern, processing state distribution in the wafer can be made apparent and can be reflected to finer adjustment of the process condition.

As another example, FIG. 13 displays cross-sectional shapes superimposed on a wafer map, so that the processing state distribution in the wafer can be known more intuitively.

Figure 14:
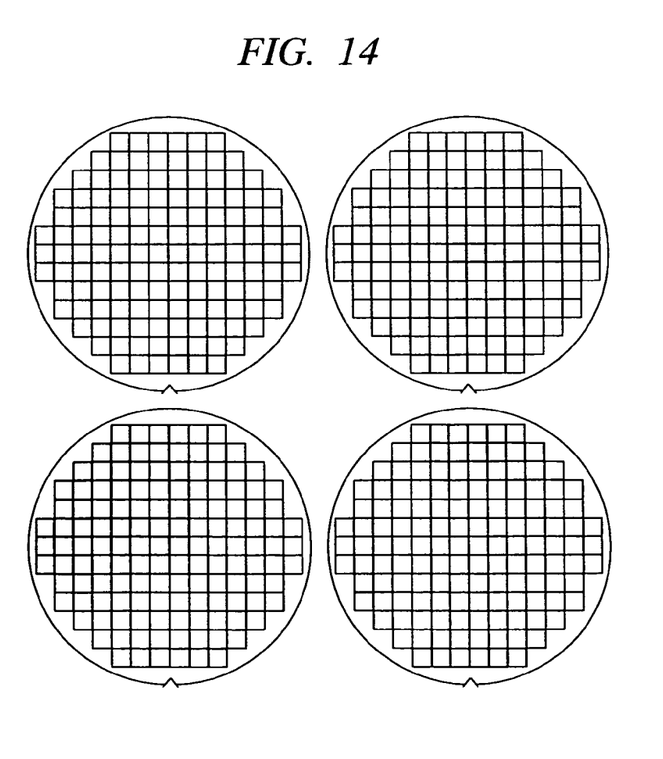
FIG. 14 is a view showing a screen display of an on-wafer distribution of a plurality of dimension parameters according to an embodiment of the invention.

As yet another example, in FIG. 14, the on-wafer distribution of a plurality of dimension parameters is displayed by being converted to a gray scale or a color. The plurality of dimension parameters is, for example, a top CD value, a sidewall angle value, line edge roughness, or an estimate value obtained by converting such parameters to, for example, a focus in a photolithography tool. Thus, by comparing and illustrating the position on the wafer and the three-dimensional shape of the pattern, the processing state distribution in the wafer can be made apparent and can be reflected to finer adjustment of the process condition.

INDUSTRIAL APPLICABILITY

As described above, the technique for measuring a three-dimensional shape according to the present invention is applicable to a high-speed multipoint measuring apparatus of a three-dimensional shape of a sample such as a semiconductor, a processing apparatus using the same, and a semiconductor device manufacturing method.

The invention claimed is:

1. A three-dimensional shape measuring apparatus comprising:
   a measurement head for measuring a three-dimensional shape of a sample;
   a stage holding the sample thereon; and
   a relative position measurer using at least one of electrostatic capacity, air pressure, and light to measure a relative position between the sample and the measurement head,
   wherein the relative position measurer includes at least two measurement members disposed so as to sandwich the measurement head therebetween; and
   wherein while the measurement head measures the three-dimensional shape of the sample, the relative position measurer obtains a weighted average of outputs of the at least two measurement members so as to acquire a change in the relative position between the sample and the measurement head, the sample being disposed at a position to be measured by the measurement head.

2. The three-dimensional shape measuring apparatus according to claim 1,
   wherein the measurement head uses at least one of:
   (1) a method of irradiating light on the sample, measuring at least one of an angle distribution or wavelength distribution of scattered light, and thereby measuring a three-dimensional shape of the sample in an irradiated area of the light;
   (2) a method of making a probe contact with the sample and measuring a three-dimensional shape of the sample by making the probe and the sample relatively scanned;
   (3) a method of irradiating a charged particle beam onto the sample, detecting a secondary electron or reflected electron from the sample, and thereby measuring a three-dimensional shape of the sample;
   (4) a method of irradiating a charged particle beam onto the sample, changing an angle of irradiation of the charged particle beam to form a plurality of images, and measuring a three-dimensional shape of the sample from a positional relation between the plurality of images acquired;

(5) a method of irradiating a charged particle beam onto the sample, detecting a hologram image of the charged particle beam, and measuring a three-dimensional shape of the sample;

(6) a method of using a change in a light intensity or a level of sharpness due to a variation of a focus position of an light image under a microscope to measure a three-dimensional shape of the sample;

(7) a method of interfering detection light and reference light under a microscope to measure a three-dimensional shape of the sample; and (8) a method of irradiating a laser beam onto the sample under a microscope, scanning the laser beam, and thereby measuring a three-dimensional shape of the sample.

3. The three-dimensional shape measuring apparatus according to claim 1,
wherein information on the relative position obtained by the relative position measurer is used to control a position of at least one of the measurement head and the stage.

4. The three-dimensional shape measuring apparatus according to claim 1,
wherein the relative position measurer is used to record a change in the relative position between the measurement head and the sample, and information on the recorded change is used to correct a measurement result of the three-dimensional shape of the sample obtained by the measurement head.

* * * * *